US 6,727,569 B1

(12) United States Patent
Gardner et al.

(10) Patent No.: US 6,727,569 B1
(45) Date of Patent: *Apr. 27, 2004

(54) METHOD OF MAKING ENHANCED TRENCH OXIDE WITH LOW TEMPERATURE NITROGEN INTEGRATION

(75) Inventors: Mark I. Gardner, Cedar Creek, TX (US); Mark C. Gilmer, Austin, TX (US); Robert Paiz, Austin, TX (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/063,081

(22) Filed: Apr. 21, 1998

(51) Int. Cl.[7] .......................... H01L 29/00; H01L 23/58
(52) U.S. Cl. .................. 257/513; 257/506; 257/510; 257/639; 257/649
(58) Field of Search ......................... 257/506, 510, 257/513, 639, 649

(56) References Cited

U.S. PATENT DOCUMENTS

| | | | | | |
|---|---|---|---|---|---|
| 4,825,277 A | * | 4/1989 | Mattox et al. | ............... | 257/506 |
| 4,855,804 A | * | 8/1989 | Bergami et al. | ............ | 257/510 |
| 4,986,879 A | | 1/1991 | Lee | ............................ | 156/649 |
| 5,168,343 A | * | 12/1992 | Sakamoto | .................... | 257/513 |
| 5,372,950 A | | 12/1994 | Kim et al. | ..................... | 437/24 |
| 5,387,540 A | | 2/1995 | Poon et al. | .................. | 438/433 |
| 5,399,520 A | | 3/1995 | Jang | ..................... | 148/DIG. 50 |
| 5,447,884 A | | 9/1995 | Fahey et al. | ................. | 438/437 |
| 5,492,858 A | | 2/1996 | Bose et al. | .................... | 437/67 |
| 5,702,977 A | * | 12/1997 | Jang et al. | ..................... | 216/38 |
| 5,780,346 A | * | 7/1998 | Arghavani et al. | ........... | 438/296 |
| 5,811,347 A | | 9/1998 | Gardner et al. | ............. | 438/435 |
| 5,985,735 A | * | 11/1999 | Moon et al. | ................. | 438/435 |
| 6,046,487 A | * | 4/2000 | Benedict et al. | ............ | 257/510 |

FOREIGN PATENT DOCUMENTS

| | | | | |
|---|---|---|---|---|
| JP | 62-281345 | * | 12/1987 | ................. 257/513 |
| JP | 2001-237307 | * | 8/2001 | ................. 257/506 |

OTHER PUBLICATIONS

Wolf, Stanley, Ph.D., *Silicon Processing for the VLSI Era, vol. 3: The Submicron Mosfet*, 1995 by Lattice Press, pp. 555–568.

Severi, M. et al., "Process Dependence of Hole Trapping in Thin Nitrided $SiO_2$ Films," IEEE Transactions on Electron Devices, vol. 36, No. 11, Nov. 1, 1989, pp. 2447–2451.

* cited by examiner

*Primary Examiner*—Steven Loke
(74) *Attorney, Agent, or Firm*—Robert C. Kowert; Meyertons, Hood, Kivlin, Kowert & Goetzel, P.C.

(57) ABSTRACT

A structure and an improved isolation trench between active regions within the semiconductor substrate involves forming on a silicon substrate and forming a nitride layer on the pad layer. Thereafter, a photoresist layer is patterned on the silicon nitride layer such that regions of the nitride layer are exposed where an isolation trench will subsequently be formed. Next, the exposed regions of the nitride layer and the pad layer situated below the exposed regions of the nitride layer are etched away to expose regions of the silicon substrate. Subsequently, isolation trenches are etched into the silicon substrate with a dry etch process. A trench liner is then formed and nitrogen incorporated into a portion of the trench liner to form an oxynitride layer. After formation of the oxynitride layer, the trench is filled with a dielectric preferably comprised of a CVD oxide. Thereafter, the CVD fill dielectric is planarized and the nitride layer is stripped away.

13 Claims, 2 Drawing Sheets

METHOD OF MAKING ENHANCED TRENCH OXIDE WITH LOW TEMPERATURE NITROGEN INTEGRATION

BACKGROUND OF THE INVENTION

1. Field of the Invention

This invention relates to semiconductor fabrication and more particularly to an improved shallow trench isolation structure incorporating a silicon oxynitride layer.

2. Description of the Relevant Art

The fabrication of an integrated circuit involves forming numerous devices in active areas of a semiconductor substrate. Select devices are interconnected by conductors which extend over a dielectric that separates or "isolates" those devices. Implementing an electrical path across a monolithic integrated circuit involves selectively connecting devices which are isolated from each other. When fabricating integrated circuits, it is therefore necessary to isolate devices built into the substrate from one another. From this perspective, isolation technology is one of the critical aspects of fabricating a functional integrated circuit.

A popular isolation technology used for a MOS integrated circuit is a technique known as the "shallow trench process". Conventional trench processes involve the steps of etching a silicon-based substrate surface to a relatively shallow depth (e.g., between 0.2 to 0.5 microns) and then refilling the shallow trench with a deposited dielectric. The trench dielectric is then planarized to complete formation of a trench isolation structure in field regions of the substrate. The trench isolation structure is formed during the initial stages of integrated circuit fabrication, before source and drain implants are placed in device areas or active areas. Trench isolation processing serves to prevent the establishment of parasitic channels in the field regions between active areas. The trench process is becoming more popular than the local oxidation of silicon process ("LOCOS"), another well known isolation technique. The shallow trench process eliminates many of the problems associated with LOCOS, such as bird's-beak and channel-stop dopant redistribution problems. In addition, the trench isolation structure is fully recessed, offering at least a potential for a planar surface. Yet further, field-oxide thinning in narrow isolation spaces is less likely to occur when using the shallow trench process.

Since trench formation involves etching the silicon substrate, it is believed that dangling bonds and an irregular grain structure form in the silicon substrate near the walls of the trench. In a subsequent processing step, the active areas of the semiconductor substrate may be implanted with impurity species to form source/drain regions therein. The semiconductor topography may be subjected to a high temperature anneal to activate the impurity species in the active areas and to annihilate crystalline defect damage of the substrate. Unfortunately, impurity species which have a relatively high diffusivity, such as boron, may undergo diffusion into the isolation region when subjected to high temperatures. The irregular grain structure may provide migration avenues through which the impurity species can pass from the active areas to the trench isolation structures. Moreover, the dangling bonds may provide opportune bond sites for diffusing impurity species, thereby promoting accumulation of impurity species near the edges of the isolation structures.

The presence of these impurity species within a trench isolation structure may result in that structure having a relatively high defect density. For example, clusters of impurity atoms may cause dislocations to form in close proximity to the lateral edges of the trench isolation structure. It is believed that the voltage required to cause dielectric breakdown of a trench isolation structure decreases as the defect density (or doping density) within the isolation structure increases. Consequently, when a voltage is applied across a conductor arranged horizontally above the trench isolation structure, dielectric breakdown may occur in those areas of the isolation structure having a high defect and/or doping density. In particular, the configuration of a local interconnect above a trench isolation structure may lead to breakdown at the edges of the isolation structure. Local interconnects are relatively short routing structures, and can be made of numerous conductive elements, e.g., doped polysilicon, or reacted polysilicon ("polycide"). As a result of placing a local interconnect in a misaligned contact opening, current may undesirably pass through the trench isolation structure in close proximity to its edges, electrically linking an overlying local interconnect to the bulk substrate. Furthermore, the threshold voltage near the lateral edges of the trench isolation structure may be reduced, and current may inadvertently flow (i.e., leak) between isolated active areas.

It would therefore be desirable to develop a technique for forming a trench isolation structure which would be resistant to breakdown when a voltage is applied across a conductor positioned above the isolation structure. Specifically, it is desirable to design a trench isolation process that results in an increased bond strength between the trench dielectric and the silicon sidewalls and reduces the potential for impurity diffusion. Such a trench isolation structure would be less likely to experience current leakage and would properly isolate the active areas which it separates.

SUMMARY OF THE INVENTION

The problems outlined above are in large part addressed by an improved shallow trench isolation process. The shallow trench isolation process hereof incorporates a silicon oxynitride (oxynitride) layer into the trench dielectric. The oxynitride layer is preferably formed by first forming an oxide layer within the trench. After formation of the oxide layer, nitrogen is incorporated into a portion of the oxide layer by use of a nitrogen containing plasma. When present in the appropriate proportion, the nitrogen bearing dielectric provides a reliable barrier to impurity diffusion. Still further, the incorporation of nitrogen via a nitrogen bearing plasma helps to minimize further consumption of the silicon sidewalls in the active areas during this process.

In one embodiment, a method is provided for forming an improved isolation trench. A pad layer is formed on a silicon substrate and a silicon nitride layer is then deposited on the pad layer. A photoresist layer is patterned onto the silicon nitride layer with a conventional photolithography process. Exposed regions of the nitride layer and the pad layer situated below the exposed nitride layer are then removed with a wet or dry etch process, whereby regions of the silicon substrate are exposed. Trenches are then etched into the exposed regions of the silicon substrate. Nitrogen is then incorporated into a portion of a dielectric liner layer formed on the sidewalls of the trench to produce an oxynitride layer. The trench is then filled with a fill dielectric and planarized so that an upper surface of the dielectric is substantially coplanar with an upper surface of the nitride layer.

In one embodiment, the nitrogen is incorporated into the structure by forming a dielectric liner layer on the sidewalls and the trench floor. The liner layer is preferably thermally grown oxide. The liner layer is preferably implanted with nitrogen to form an oxynitride layer. The nitrogen is preferably incorporated using a low temperature nitrogen plasma formed using either nitric oxide (NO), nitrous oxide ($N_2O$), or ammonia ($NH_3$). In the presently preferred embodiment, the liner layer including the thermally grown oxide and the oxynitride layer is typically 200–500 angstroms thick.

It is contemplated that the isolation structure is formed in a silicon substrate between laterally displaced active regions. The isolation structure includes a substantially U-shaped trench. The sidewalls of the trench are substantially perpendicular to trench floor. The sidewalls and trench floor are bounded by a dielectric liner layer. An oxynitride layer substantially covers the liner layer. A dielectric material fills the trench and is bounded by the oxynitride layer. The dielectric fill layer is substantially coplanar; with the upper surface of the silicon substrate.

BRIEF DESCRIPTION OF THE DRAWINGS

Other objects and advantages of the invention will become apparent upon reading the following detailed description and upon reference to the accompanying drawings in which.

Figure 1:
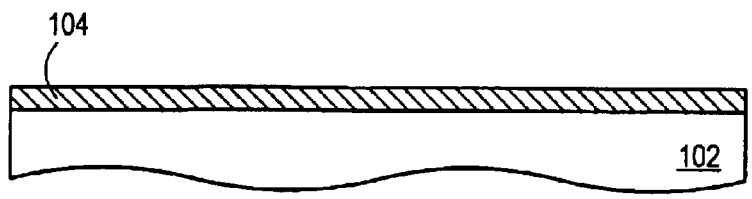
FIG. 1 is partial cross-sectional view of a semiconductor substrate upon which a pad oxide layer is formed.

While the invention is susceptible to various modifications and alternative forms, specific embodiments thereof are shown by way of example in the drawing and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

Figure 7:
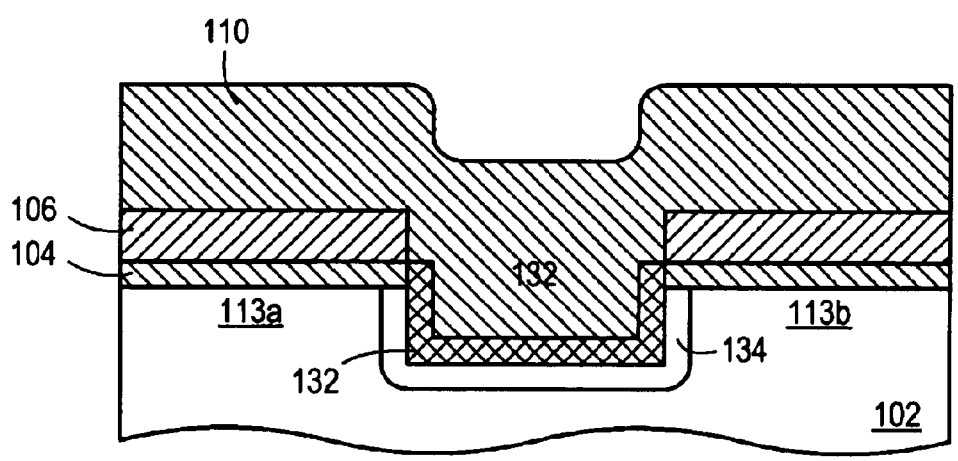
FIG. 7 is a processing step subsequent to FIG. 6, in which a dielectric layer is deposited to fill the trench.
Figure 8:
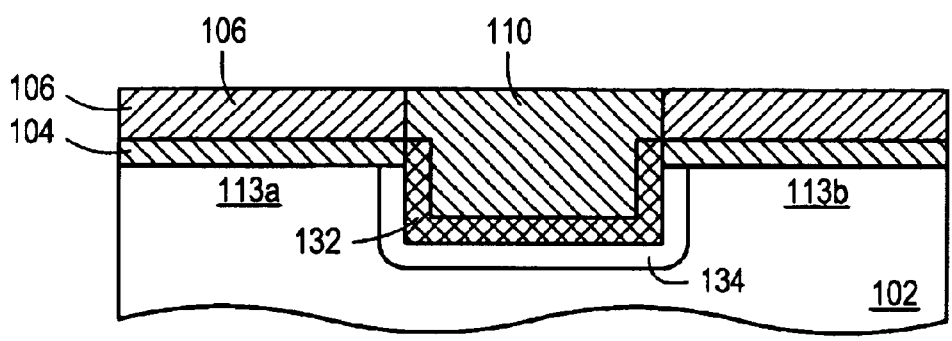
FIG. 8 is a processing step subsequent to FIG. 7, in which the dielectric fill layer is planarized.
Figure 9:
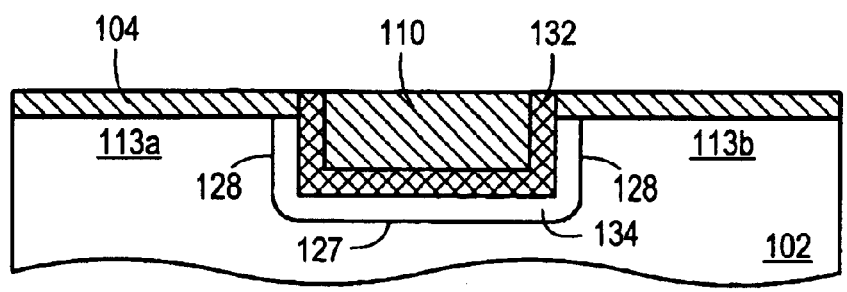
FIG. 9 is a processing step subsequent to FIG. 8, in which the nitride layer is stripped, and the dielectric fill layer further planarized.

Turning now to the drawings, FIGS. 1–9 illustrate a process sequence for forming an isolation structure between adjacent active regions within a semiconductor substrate. Referring briefly to FIG. 9, an improved isolation structure is shown therein. The isolation structure includes a substantially U-shaped trench having a trench floor 127 and sidewalls 128. Sidewalls 128 are substantially perpendicular to dielectric floor 127. Sidewalls 128 and trench floor 127 are bounded by a thermal oxide layer 134 and an oxynitride layer 132. Dielectric 110 fills the trench and is bounded by oxynitride layer 132.

Figure 2:
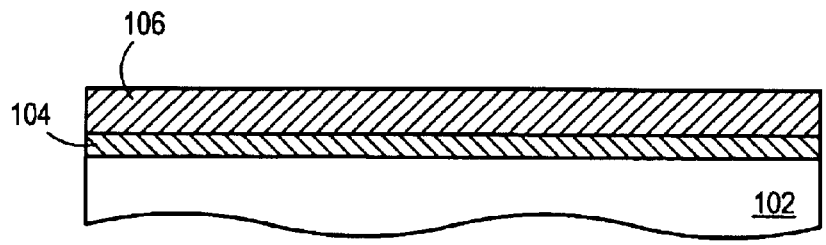
FIG. 2 is a processing step subsequent to FIG. 1, in which a nitride layer is formed on the pad layer.

Turning now to the drawings, FIG. 1 depicts a semiconductor substrate 102 across which a thin layer of thermally grown oxide 104 is preferably disposed. The oxide layer 104 may also be CVD deposited upon the silicon substrate 102. Semiconductor substrate 102 is preferably single crystalline silicon. As shown in FIG. 2 a dielectric layer 106, preferably nitride ($Si_3N_4$), may be deposited across oxide layer 104. The oxide deposition and the nitride deposition may be performed using, e.g., a horizontal tube LPCVD reactor. When a nitride/oxide stack, as depicted in FIG. 2 is used, the oxide layer 104 serves as a "pad oxide" to reduce inherent stresses that exist between CVD nitride on a silicon substrate. The nitride/oxide stack, as depicted in FIG. 2 may be used as a masking layer for the subsequent steps.

Figure 3:
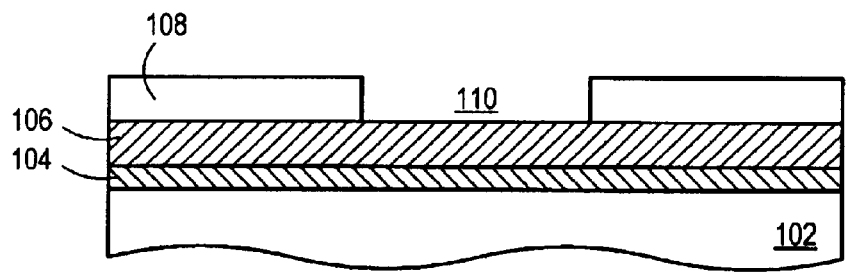
FIG. 3 is a processing step subsequent to FIG. 2, in which a photoresist layer is patterned on the nitride layer.

As shown in FIG. 3, a patterned photoresist layer 108 is formed on nitride layer 106. Patterning of photoresist layer 108 is accomplished with a photolithographic step as is well known in the semiconductor processing field. Photoresist layer 108 is patterned such that window 110 is opened in photoresist layer 108 exposing a portion of the underlying layer of silicon nitride 106.

Figure 4:
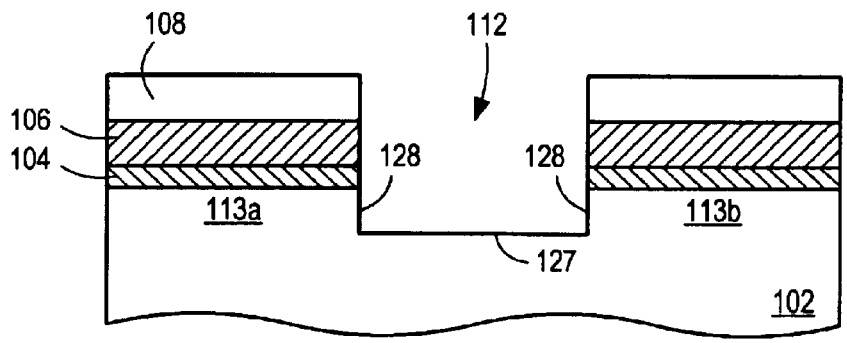
FIG. 4 is a processing step subsequent to FIG. 3, in which a trench is formed in the semiconductor substrate through the nitride layer and the pad layer.

FIG. 4 shows a subsequent processing step in which trench 112 has been etched into semiconductor substrate 102 between first active region 113a and second active region 113b. Trench 112 is preferably formed with a plasma etch process designed to etch nitride layer 106 in lieu of photoresist layer 108 in the regions corresponding to window 110. Plasma etching trench 112 into silicon substrate is believed to create lattice damage in the trench floor 127 and, to a lesser extent, trench sidewalls 128. Lattice damage is believed to be attributable to the bombardment of the substrate by the plasma ions due to the electric field present in a typical parallel plate chamber. In addition, irregularities in trench floor 127 are believed to be traceable to incomplete removal of the silicon nitride layer 106 which can result in regions of the silicon substrate 102 upper surface that etch more slowly than the regions over which nitride was completely removed, thereby resulting in an irregularly shaped trench floor 127.

Lattice irregularities are believed to be caused, in part, by plasma ions that penetrate deep into silicon substrate 102 along dislocations within substrate 102. Because the plasma etch process preferably used to form trench 112 creates lattice damage in substrate 102, a large number of dangling bonds are created at sidewalls 128 and floor 127 of trench 112. The dangling bonds can contribute to increased leakage current from first active area 113a to second active area 113b. The dangling bonds can also degrade the reliability of trench isolation structure 100. The dry etch process preferably used to form trench 112 is designed such that trench sidewalls 128 are substantially perpendicular to trench floor 127. Anisotropic etching of silicon nitride, silicon dioxide, and silicon are generally well known.

Figure 5:
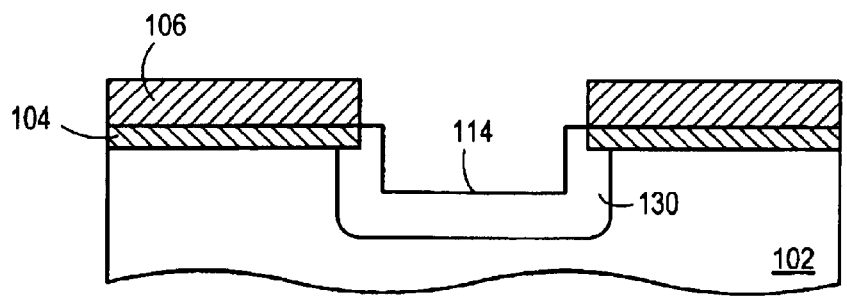
FIG. 5 is a processing step subsequent to FIG. 4, in which a dielectric liner layer is formed on the sidewalls and floor of the trench.
Figure 6:
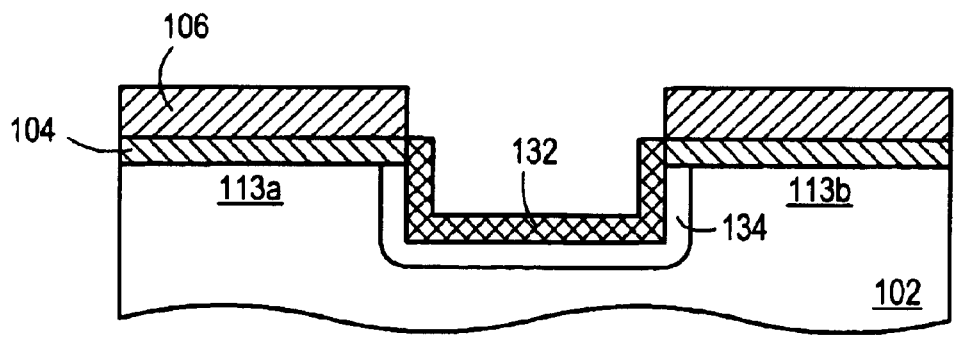
FIG. 6 is processing step subsequent to FIG. 4, in which nitrogen is incorporated into the liner layer formed on the sidewalls and floor of the trench.

In the embodiment shown in FIG. 5, oxide is grown to form a dielectric liner layer 130. After the formation of liner layer 130, nitrogen is preferably incorporated into a portion of liner layer 130 to form a silicon oxynitride (oxynitride) layer, as shown in FIG. 6. The oxynitride layer 132 is preferably formed by use of a nitrogen plasma. The use of a nitrogen plasma preferably converts a portion of the oxide film to silicon oxynitride. The nitrogen plasma may be formed by injecting a nitrogen bearing gas into a plasma reactor. A nitrogen bearing gas may include ammonia gas (NH₃), nitrous oxide gas (N₂O), nitric oxide gas (NO) or a mixture of the three gasses. The nitrogen bearing gas is preferably injected into a plasma reactor using a high frequency RF power source of 100 to about 400 W. The incorporation of nitrogen is preferably performed at temperatures between about 25 to 400° C.

The use of a nitrogen plasma allows the incorporation of nitrogen at relatively low temperatures. The plasma based incorporation of nitrogen is performed at temperatures that are typically lower than other methods of nitrogen introduction, such as annealing in a nitrogen containing atmosphere where temperatures typically range from 700 to 1000° C. The relatively low temperatures of the plasma process preferably allow the formation of oxynitride layer 132, while minimizing further oxidation of the silicon substrate. If the temperatures are too high, such as those used in an anneal process, the oxide layer 130 may expand further into the silicon substrate. By running at low temperatures the amount of encroachment of the oxide layer 130 upon active areas 113a and 113b may be controlled during nitrogen incorporation.

The implantation of nitrogen is preferably performed such that only an upper portion 132 of the oxide layer 130 is converted to oxynitride. After implantation the lower portion 134 of oxide layer 130 is preferably substantially free of nitrogen impurities. Moreover, the oxynitride layer 132 is formed such that the oxynitride layer is substantially self aligned with the edge of the nitride layer 106 bordering the trench. Since the nitride layer masks the implantation of the nitrogen into layers below the nitride layer, this self alignment process may ensure that nitrogen is only incorporated into the oxide layer lining the trench. The formation of a relatively nitrogen free oxide layer 134 between the silicon substrate 102 and the oxynitride layer 132 is believed to minimize the undesirable migration of nitrogen into the active areas 113a and 113b during subsequent processing steps. Thus, oxide layer 134 helps to prevent migration of nitrogen into the active areas 113a and 113b, while the oxynitride layer 132 preferably helps prevent the migration of impurity atoms from the active areas into the isolation trench. It is the combination of these layers that allows the isolation structure to more effectively separate the active areas.

FIG. 7 depicts a subsequent processing step in which a dielectric fill layer 110 is deposited over the substrate. In the presently preferred embodiment, dielectric fill layer 110 comprises CVD oxide formed from a TEOS source. FIG. 8 shows a subsequent processing step in which dielectric fill layer 110 exterior to trench 112 has been removed. In the presently preferred embodiment, the planarization of dielectric fill layer 110 is accomplished with a chemical mechanical polish.

FIG. 9 depicts a subsequent processing step in which the nitride layer is removed and the dielectric fill layer extending exterior to the trench is removed. The removal of nitride layer 106 is preferably accomplished with a heated solution of phosphoric acid. The removal of nitride layer may be accomplished by a dry or wet etch process. The oxide layer may also be removed by a dry or wet etch process. Subsequently, a portion of the dielectric fill layer is preferably removed such that the dielectric fill layer is substantially coplanar with either the oxide layer or, if the oxide layer has been removed, the upper surface of the silicon substrate. After planarization of the fill dielectric, a trench isolation structure is formed between laterally displaced active regions 113a and 113b within substrate 102.

By incorporating nitrogen into trench liner 130, the isolation structure minimizes leakage from first active area 113a to second active area 113b. In addition, the nitrogen provides an excellent barrier against diffusion of sodium, boron, and other contaminants.

It will be appreciated to those skilled in the art having the benefit of this disclosure that both the isolation structure and the method for making an isolation structure described herein are capable of applications with numerous types of MOS-processed circuits. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claim be interpreted to embrace all such modifications and changes and, accordingly the specification and drawings are to be regarded in an illustrative rather than a restrictive sense.

What is claimed is:

1. An isolation structure formed in a silicon substrate between laterally displaced active regions comprising:

a trench comprising sidewalls substantially perpendicular to a trench floor;

an oxide layer formed on the sidewalls and trench floor of the isolation trench, wherein the oxide layer is a thermally grown oxide layer, wherein an upper portion of the oxide layer comprises implanted nitrogen, wherein a lower portion of the oxide layer is substantially free of nitrogen, and wherein the oxide layer entirely fills a first portion of the trench; and a dielectric fill layer formed on the upper portion of the oxide layer, wherein the dielectric fill layer entirely fills a second portion of the trench, and wherein the dielectric fill layer is substantially coplanar with a pad oxide formed on an upper surface of the silicon substrate.

2. The isolation structure of claim 1, wherein the oxide layer and the dielectric fill layer substantially fill the trench.

3. The isolation structure of claim 1, wherein the upper portion of the oxide layer and the lower portion of the oxide layer combined has a thickness of about 200 angstroms to about 500 angstroms.

4. The isolation structure of claim 1, wherein the upper portion of the oxide layer is formed by incorporating nitrogen into the oxide layer self-aligned to an opening within the pad oxide formed un an upper surface of the silicon substrate.

5. The isolation structure of claim 1, wherein the upper portion of the oxide layer is formed by incorporating nitrogen into the oxide layer using a nitrogen plasma.

6. The isolation structure of claim 1, wherein the lower portion of the oxide layer is formed adjacent to and in contact with the sidewalls of the trench and the trench floor.

7. An isolation structure formed in a silicon substrate between laterally displaced active regions comprising:

a substantially U-shaped trench comprising sidewalls substantially perpendicular to a trench floor;

an oxide layer formed on and within the sidewalls and trench floor of the isolation trench, wherein the oxide layer is a thermally grown oxide, wherein an implanted portion of the oxide layer is arranged adjacent to and in contact with a portion of the oxide layer formed within the sidewalls and trench floor, wherein the implanted portion of the oxide layer comprises nitrogen implanted from a nitrogen plasma such that the implanted portion of the oxide layer comprises oxynitride; and a dielectric fill layer formed on the oxide layer, wherein an upper surface of the dielectric fill layer is substantially coplanar with a pad oxide formed on an upper surface of the silicon substrate.

8. The isolation structure of claim 7, wherein the oxide layer has a thickness of about 200 to 500 angstroms.

9. The isolation structure of claim 7, wherein the oxynitride is formed by incorporating nitrogen into the oxide layer self-aligned to an opening within the pad oxide formed on an upper surface of the silicon substrate.

10. The isolation structure of claims 7, wherein said dielectric fill layer is silicon dioxide.

11. The isolation structure of claim 7, wherein the implanted portion of the oxide layer comprises an upper portion of the oxide layer.

12. The isolation structure of claim 1, wherein the dielectric fill layer substantially fills the trench.

13. The isolation structure of claim 7, wherein a lower portion of the oxide layer is substantially free of nitrogen.

* * * * *